United States Patent [19]
Zenitani et al.

[11] Patent Number: 5,788,467
[45] Date of Patent: Aug. 4, 1998

[54] FAN UNIT STRUCTURE FOR AN ELECTRONIC DEVICE ADAPTED TO BE INSERTED AND MOUNTED IN A CABINET

[75] Inventors: Hideki Zenitani; Hisao Hayashi, both of Kawasaki, Japan

[73] Assignee: Fujitsu Limited, Kanagawa, Japan

[21] Appl. No.: 745,850

[22] Filed: Nov. 12, 1996

[30] Foreign Application Priority Data

Jun. 10, 1996 [JP] Japan ................................ 8-146916

[51] Int. Cl.$^6$ ........................................ H05K 7/20
[52] U.S. Cl. ............... 417/360; 417/423.5; 417/423.7; 361/694; 361/695
[58] Field of Search .................. 417/360, 423.5, 417/423.7, 477.2; 361/688, 694, 695, 696, 697

[56] References Cited

U.S. PATENT DOCUMENTS

| | | | |
|---|---|---|---|
| 4,774,631 | 9/1988 | Okuyama et al. | 361/384 |
| 4,834,615 | 5/1989 | Mauch et al. | 415/213.1 |
| 4,911,231 | 3/1990 | Horne et al. | 361/695 |
| 5,101,321 | 3/1992 | Remise et al. | 361/695 |
| 5,398,161 | 3/1995 | Roy | 361/695 |
| 5,414,591 | 5/1995 | Kimura et al. | 361/695 |
| 5,460,441 | 10/1995 | Hastings et al. | 361/695 |

*Primary Examiner*—Timothy Thorpe
*Assistant Examiner*—Ted Kim
*Attorney, Agent, or Firm*—Helfgott & Karas, P C.

[57] ABSTRACT

A fan unit adapted to be detachably inserted and mounted into a cabinet for an electronic device accommodating a plurality of electronic circuit units, for forcibly air-cooling the interior of the cabinet. The fan unit includes a fan, a unit housing, and a connector. The fan has a frame member and a motor supported to the frame member. The motor has a rotating shaft on which an impeller is mounted. The impeller is rotated by the motor to generate an air flow. The unit housing is integrally formed by resin molding. The unit housing is of a substantially rectangular parallelepiped box-shape having a front plate, a rear plate, a lower plate, a first side plate, a second side plate, and an upper opening. The unit housing has a recessed fan mounting portion having an upper opening inside the lower plate, for engagingly accommodating the fan. The lower plate has at its portion corresponding to a bottom surface of the fan mounting portion a ventilation opening for allowing pass of the air flow generated by the fan. The connector is provided for electrical connection with the electric device. The connector is mounted on the rear plate so that a part of the connector is exposed.

15 Claims, 16 Drawing Sheets

5,788,467

FAN UNIT STRUCTURE FOR AN ELECTRONIC DEVICE ADAPTED TO BE INSERTED AND MOUNTED IN A CABINET

BACKGROUND OF THE INVENTION

1. Field of the Invention

The present invention relates to a fan unit adapted to be detachably inserted and mounted into a cabinet for an electronic device accommodating a plurality of electronic circuit units, for forcibly air-cooling the interior of the cabinet.

2. Description of the Related Art

In an electronic device such as a communication device, a plurality of electronic circuit units each configured by mounting a plurality of electronic components on a printed wiring board are inserted into a shelf having a back board and plug-in connected with the back board. The shelf and other similar shelves each accommodating such electronic circuit units are also accommodated into a cabinet to configure the electronic device. A plurality of fan units for forcibly air-cooling the interior of the cabinet are inserted and mounted into the cabinet. Each fan unit is composed of a unit housing and a fan mounted in the unit housing. The unit housing is of a box-shape having an upper opening, formed by bending a sheet metal. The fan is composed of a substantially rectangular frame member having an air inlet and an air outlet, and a motor supported to a substantially central portion of the frame member. An impeller is mounted on an operating shaft of the motor. The impeller is rotated to generate an air flow directed from the air inlet toward the air outlet. Each of the air inlet and the air outlet of the fan is provided with a finger guard for preventing insertion of human fingers. The finger guard is composed of a plurality of concentric ring wires of different diameters and four substantially U-shaped wires extending radially and spaced circumferentially at about 90° intervals. The ring wires and the U-shaped wires are joined at their intersections by welding or the like. The fan and the pair of finger guards are mounted on the unit housing by means of a plurality of fan mounting screws each having a special shape. The lower plate of the unit housing is formed with a ventilation opening opposed to the air inlet of the fan.

A handle is mounted on the front plate of the unit housing to facilitate carrying of the fan unit and mounting/removal of the fan unit into/from the cabinet. Further, unit fixing screws for fixing the fan unit to the cabinet are mounted on the front plate of the unit housing in such a manner that each screw is inserted into a through-hole formed in the front plate and a stop is mounted to prevent falling of the screw from the front plate. A printed wiring board on which electronic components including an indicator lamp is fixed by screws inside the front plate of the unit housing, and the front plate is formed with a through-hole for exposing the indicator lamp so that the indicator lamp can be viewed from the outside. A unit-side connector to be engaged with a cabinet-side connector located in the depth of the cabinet is fixed by screws to the rear plate of the unit housing. The unit-side connector is electrically connected through a cable to the fan and the printed wiring board.

Such a conventional fan unit has the following drawbacks. The unit housing is formed from a sheet metal, so that the fan unit is greatly heavy in weight and inconvenient to handle. The fan and the finger guards are mounted on the unit housing by the fan mounting screws, so that in the event of failure of the fan, the work for unscrewing and screwing the fan mounting screws is troublesome. The parts including the fan, the printed wiring board, and the connector are mounted by screws, so that the number of parts is large to cause an increase in cost. In particular, each fan mounting screw has a special shape and it is therefore expensive. Further, each unit fixing screw is unstable in position because of its structure, so that the screw becomes out of alignment with a tapped hole of the cabinet in many cases, causing a troublesome work in mounting the fan unit to the cabinet. Further, the work for mounting the unit fixing screws to the front plate of the unit housing is also troublesome.

SUMMARY OF THE INVENTION

It is therefore an object of the present invention to provide a fan unit which can be reduced in weight and can be easily assembled and mounted at a low cost.

In accordance with an aspect of the present invention, there is provided a fan unit adapted to be detachably inserted and mounted into a cabinet for an electronic device accommodating a plurality of electronic circuit units, for forcibly air-cooling an interior of the cabinet, comprising a fan means having a frame member and a motor supported to the frame member, the motor having a rotating shaft on which an impeller is mounted, the impeller being rotated by the motor to generate an air flow; a unit housing integrally formed by resin molding, the unit housing being of a substantially rectangular parallelepiped box-shape having a front plate, a rear plate, a lower plate, a first side plate, a second side plate, and an upper opening, the unit housing having a recessed fan mounting portion inside the lower plate, for engagingly accommodating the fan means, the fan mounting portion having an upper opening, the lower plate having at its portion corresponding to a bottom surface of the fan mounting portion a first ventilation opening for allowing pass of the air flow generated by the fan means; and a connector means for electrical connection with the electronic device, the connector means being mounted on the rear plate of the unit housing so that a part of the connector means is exposed.

The unit housing is integrally formed by resin molding, thereby reducing the weight. The fan means is engaged into the recessed fan mounting portion of the unit housing, thereby eliminating screws for mounting the fan means and facilitating the work for mounting the fan means. Since the number of parts can be reduced as by elimination of the screws, the fan unit can be assembled at a low cost.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
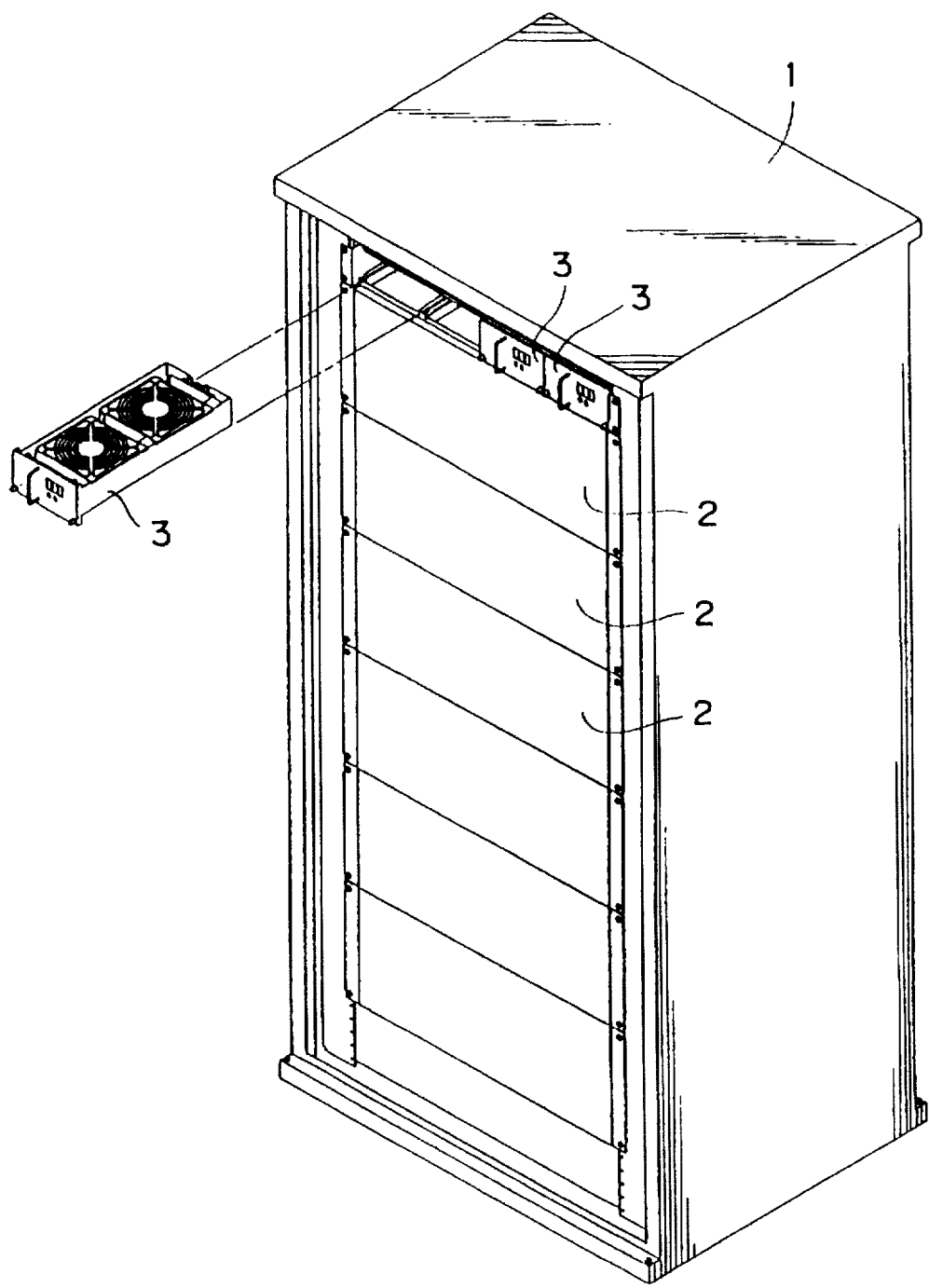
FIG. 1 is an external perspective view of an electronic device to which the present invention is applied.

FIG. 1 is a perspective view of an electronic device in which a fan unit according to the present invention is inserted and mounted. In FIG. 1, reference numeral 1 denotes a cabinet of an electronic device such as a communication device. A plurality of multilayered shelves 2 are accommodated in the cabinet 1. Each shelf 2 is open on its upper and lower sides to allow communication of air, and has a back board on the rear side. Each shelf 2 has a front opening for allowing insertion of a plurality of electronic circuit units in their vertical positions. The electronic circuit units inserted into the shelf 2 are plug-in connected to the back board, and thereafter the front opening of the shelf 2 is closed by a front board. Each electronic circuit unit is configured by mounting a plurality of electronic components such as an IC, LSI, and connector on a printed wiring board. An air suction opening is formed in the lowermost layer of the cabinet 1. A plurality of fan units 3 are inserted and mounted in the uppermost layer of the cabinet 1. Each fan unit 3 is a device for forcibly air-cooling the interior of the cabinet 1 in such a manner as to generate an air flow from the lower side to the upper side of the cabinet 1 and cool the interior of the cabinet 1 by the air flow. Behind a portion of the cabinet 1 for inserting and mounting each fan unit 3, there are provided a cabinet-side connector for making electrical connection with the fan unit 3 and a pair of unit guide projections.

Figure 2:
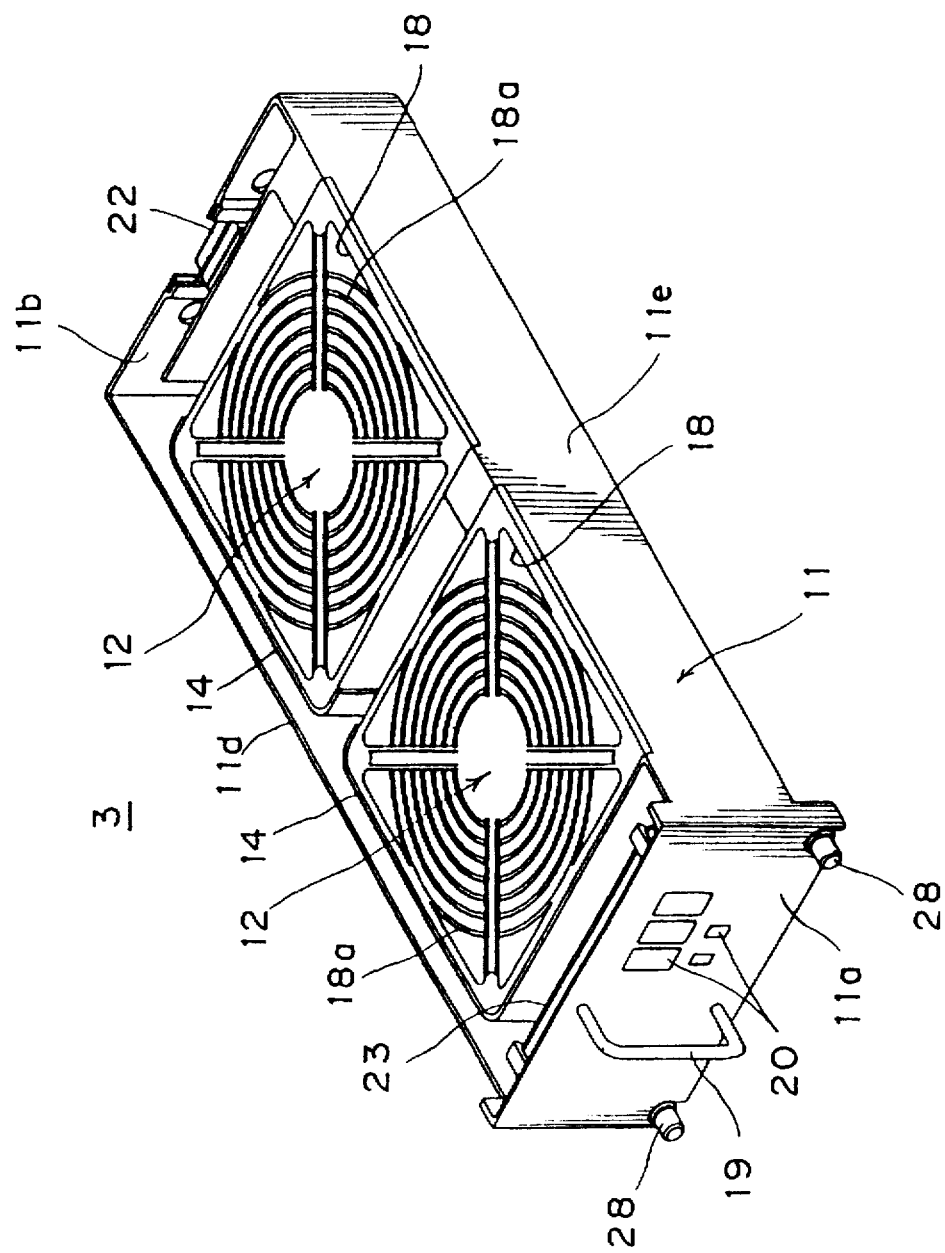
FIG. 2 is a perspective view of a fan unit according to a preferred embodiment of the present invention.
Figure 3:
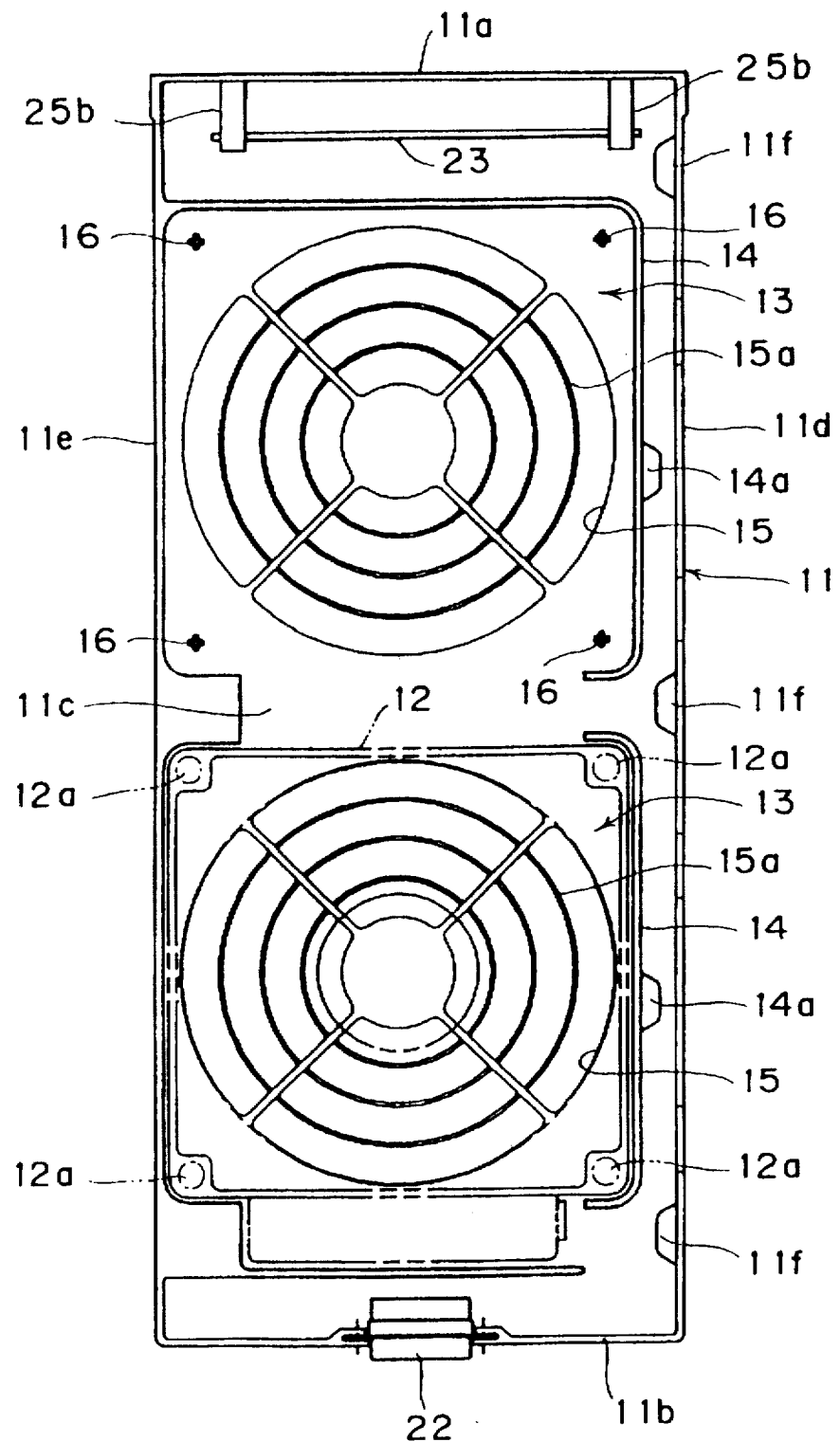
FIG. 3 is a top plan view of a unit housing of the fan unit.
Figure 4:
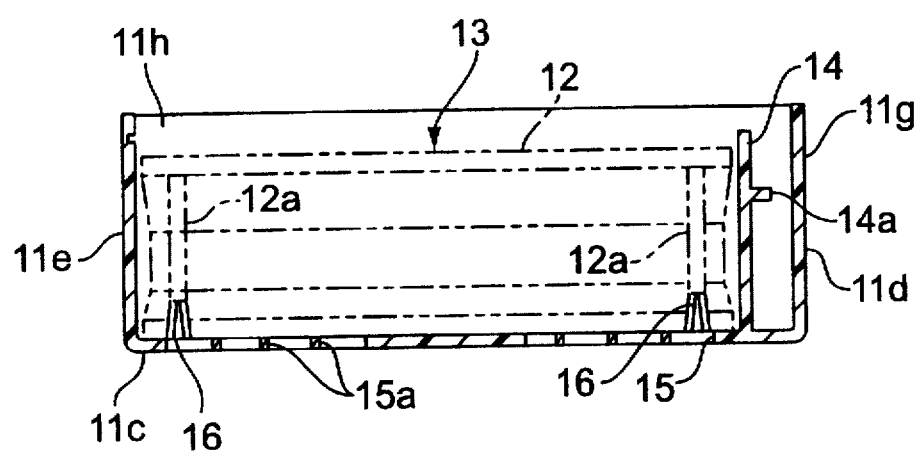
FIG. 4 is a transverse sectional view of FIG. 3.
Figure 5:
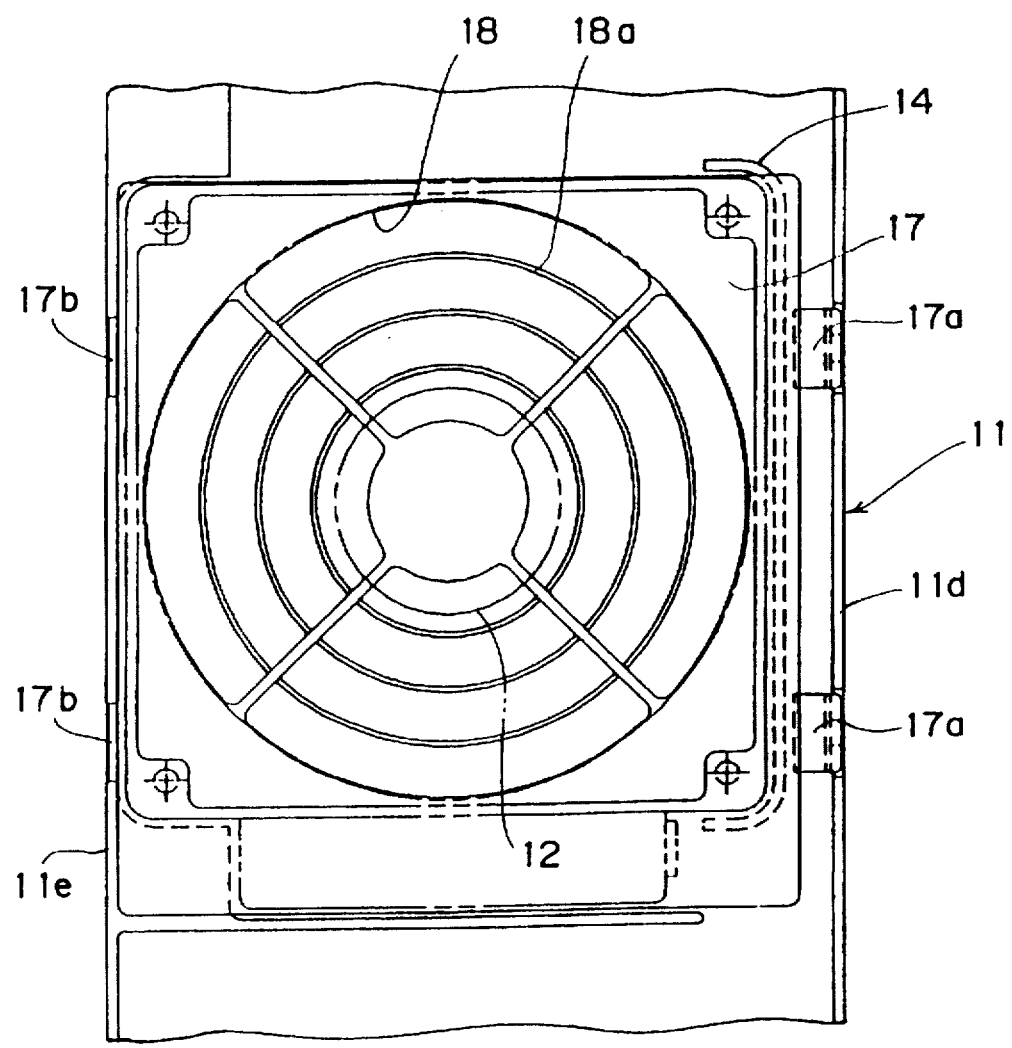
FIG. 5 is an enlarged top plan view of a part of the fan unit.
Figure 6:
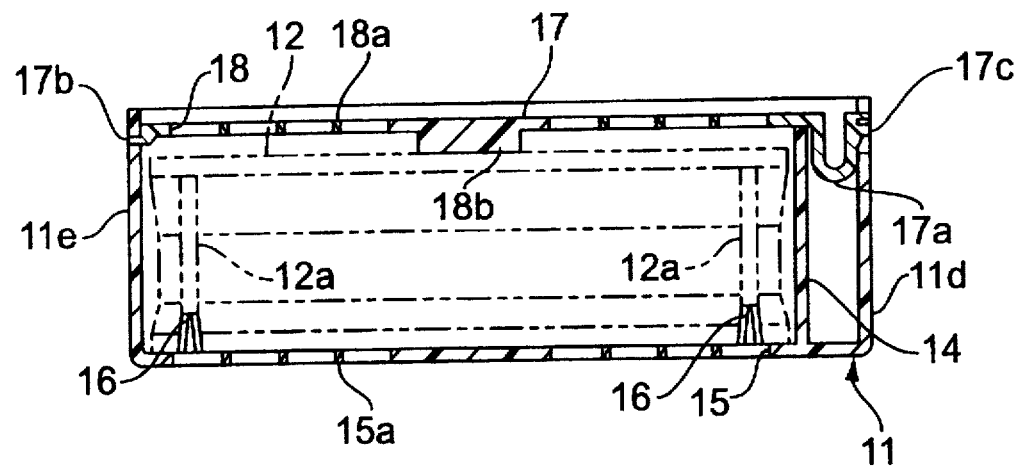
FIG. 6 is a transverse sectional view of FIG. 5.

FIG. 2 is a perspective view showing the general configuration of the fan unit 3. FIG. 3 is a plan view of a unit housing 11 of the fan unit 3, and FIG. 4 is a sectional view of the unit housing 11. FIG. 5 is an enlarged plan view of a part of the fan unit 3, and FIG. 6 is a sectional view of the fan unit 3. The fan unit 3 is configured by accommodating a pair of fans (fan means) 12 in the unit housing 11. Each fan 12 is composed of a substantially rectangular frame member having an air inlet on the lower side and an air outlet on the upper side, and a motor supported at a substantially central portion of the frame member and having an operating shaft on which an impeller is mounted, whereby an air flow directed from the air inlet toward the air outlet is generated by rotation of the impeller. The frame member has four vertical through-holes (fan fixing holes) 12a at four corner portions. The unit housing 11 has a front plate 11a, a rear plate 11b, a lower plate 11c, a left side plate 11d, and a right side plate 11e. Thus, the unit housing 11 is formed as a box of substantially rectangular parallelepiped having an upper opening opposed to the lower plate 11c. The unit housing 11 is integrally formed by resin molding.

The unit housing 11 has a pair of recessed fan mounting portions 13 for respectively engagingly accommodating the pair of fans 12 (the frame members). Each fan mounting portion 13 is formed by a part of the right side plate 11e, a part of the lower plate 11c, and a vertical inner wall 14 formed integrally with the lower plate 11c. The bottom wall of each fan mounting portion 13 (the lower plate 11c of the unit housing 11) has a ventilation opening (first ventilation opening) 15 corresponding to the air inlet of each fan 12. The ventilation opening 15 is provided with a finger guard portion (first finger guard portion) 15a like a spiderweb. The finger guard portion 15a is composed of a small-diameter central disk, a plurality of thin ring lines of different diameters arranged in concentrical relationship with the central disk, and four support lines radially extending from the central disk and circumferentially spaced from each other at about 90° intervals. The finger guard portion 15a is located in the corresponding ventilation opening 15 of the lower plate 11c, and is formed integrally with the unit housing 11. Each ring line and each support line of the finger guard portion 15a have circular, oval, or elliptical cross sections for a reduction of air resistance. As shown in FIGS. 3 and 4, the bottom surface of each fan mounting portion 13 (the inner surface of the lower plate 11c of the unit housing 11) is integrally formed with a plurality of fan fixing projections 16 taperingly projecting inward of the fan mounting portion 13. The fan fixing projections 16 are formed at positions corresponding to the fan fixing holes 12a of each fan 12. A space defined between the left side plate 11d of the unit housing 11 and the inner walls 14 opposed thereto is formed as a cable duct for accommodating various cables. The left side plate 11d and the inner walls 14 opposed thereto are respectively formed with a plurality of cable holding projections 11f and 14a arranged in a staggered configuration to prevent escape of the cables out of the cable duct.

As shown in FIGS. 5 and 6, the upper opening of each fan mounting portion 13 is openably closed by an upper plate 17. The upper plate 17 is integrally formed by resin molding. The upper plate 17 has a ventilation opening (second ventilation opening) 18 at a position corresponding to the air outlet of each fan 12. The ventilation opening 18 is provided with a finger guard portion (second finger guard portion) 18a like a spiderweb. The finger guard portion 18a is composed of a small-diameter central disk, a plurality of thin ring lines of different diameters arranged in concentrical relationship with the central disk, and four support lines radially extending from the central disk and circumferentially spaced from each other at about 90° intervals. The finger guard portion 18a is located in the ventilation opening 18 of the upper plate 17, and is formed integrally with the upper plate 17. Each ring line and each support line of the finger guard portion 18a have circular, oval, or elliptical cross sections for a reduction of air resistance. The upper plate 17 has at its one side edge a pair of latch portions 17a each having a substantially U-shaped cross section and having an engaging projection 17c at the outer end. Further, the upper plate 17 has at its other side edge a pair of engaging projections (hooks) 17b. The left side plate 11d of the unit housing 11 is formed with engaging holes 17g (first engaging hole) engaging with the engaging projections 17c of the latch portions 17a, and the right side plate 11e is formed with engaging holes 11h (second engaging hole) engaging with the engaging projections 17b.

The upper plate 17 has a fan pressing portion 18b projecting from the inner surface of the central disk of the finger guard portion 18a. In mounting each fan 12, the fan 12 is first inserted (engaged) into the corresponding fan mounting portion 13. At this time, the fan fixing projections 16 come to engagement with the corresponding fan fixing holes 12a of the fan 12, thereby supporting and fixing the fan 12 in the fan mounting portion 13. Then, the engaging projections 17b of the upper plate 17 are inserted (engaged) into the corresponding engaging holes of the right side plate 11e, and the upper plate 17 is next pivoted toward the fan 12 about the engaging projections 17b. At this time, the latch portions 17a is slightly flexed to allow their respective engaging projections to come into engagement with the corresponding engaging holes of the left side plate 11d. In this condition, the fan 12 is pressed by the fan pressing portion 18b of the upper plate 17. Thus, the fan 12 is securely fixed to the unit housing 11. As shown in FIG. 2, a handle 19 is mounted on the outer surface of the front plate 11a of the unit housing 11 for the purposes of easy carrying of the fan unit 3 and insertion/removal of the fan unit 3 into/from the cabinet 1. The front plate 11a is formed with a plurality of through-holes 20. A unit-side connector 22 for electrical connection to the electronic device is mounted on the rear plate 11b of the unit housing 11. The unit-side connector 22 is engaged and connected with a cabinet-side connector provided inside the cabinet 1.

Figure 7:
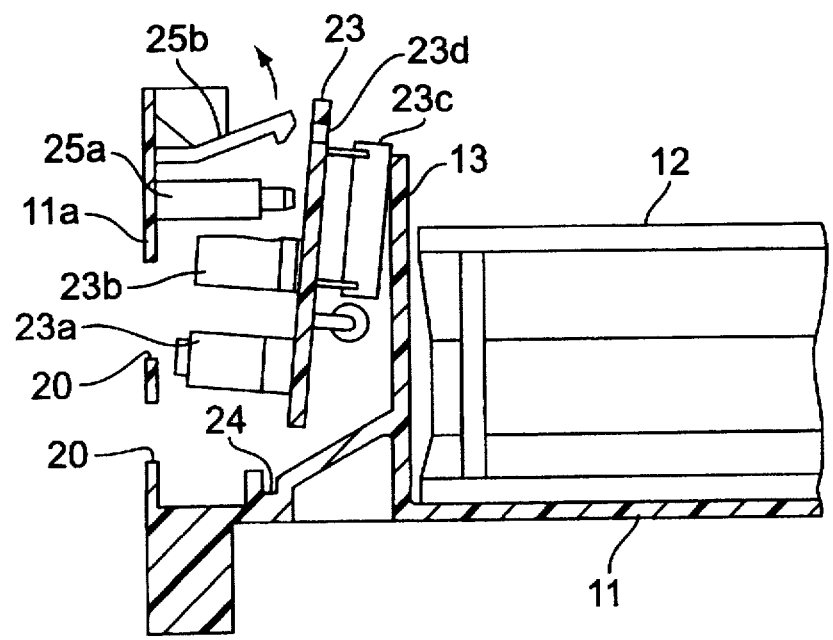
FIG. 7 is a longitudinal sectional view of a front portion of the fan unit, illustrating a condition where a printed wiring board is being mounted into the fan unit.
Figure 8:
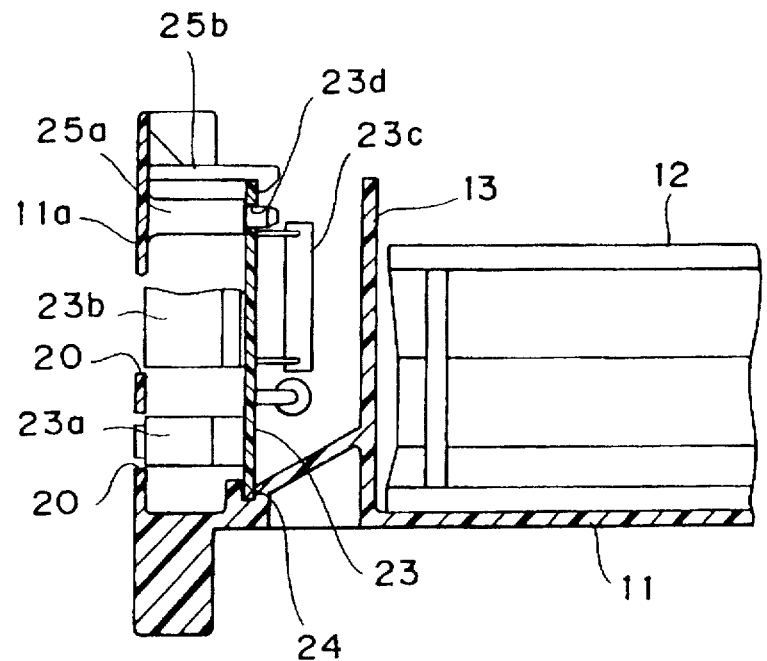
FIG. 8 is a view similar to FIG. 7, illustrating a condition where the printed wiring board has been mounted into the fan unit.

FIGS. 7 and 8 are sectional views showing the configuration of a printed wiring board accommodating portion and its associated parts of the fan unit 3. There is defined between the front plate 11a and the fan mounting portion 13 (on the front plate 11a side) a recessed printed wiring board accommodating portion for accommodating a printed wiring board 23. Various electronic components including an LED (indicator lamp) 23a, a fuse 23b, and an IC 23c are mounted on the printed wiring board 23. A pair of through-holes 23d are formed in the vicinity of two corners of an upper edge portion of the printed wiring board 23. A printed wiring board guide groove 24 is formed on the inner surface of the lower plate 11c of the unit housing 11 so as to extend substantially parallel to the front plate 11a and be open to the upper side. A pair of printed wiring board pressing projections 25a each having a small-diameter portion at the front end and a pair of printed wiring board holding hooks 25b each having a hook portion at the front end are formed on the inner surface of the front plate 11a. In mounting the printed wiring board 23, the lower edge of the printed wiring board 23 is first inserted into the guide groove 24, and the printed wiring board 23 is next pivoted toward the front plate 11a about the lower edge as shown in FIG. 7. At this time, the small-diameter portion of each pressing projection 25a is inserted into the corresponding through-hole 23d of the printed wiring board 23, and the hook portion of each holding hook 25b comes to engagement with the upper edge of the printed wiring board 23 as shown in FIG. 8. Thus, the printed wiring board 23 is mounted in the unit housing 11. In this condition, the LED 23a and the fuse 23b are exposed to the outside through the through-holes 20 of the front plate 11a.

Figure 9:
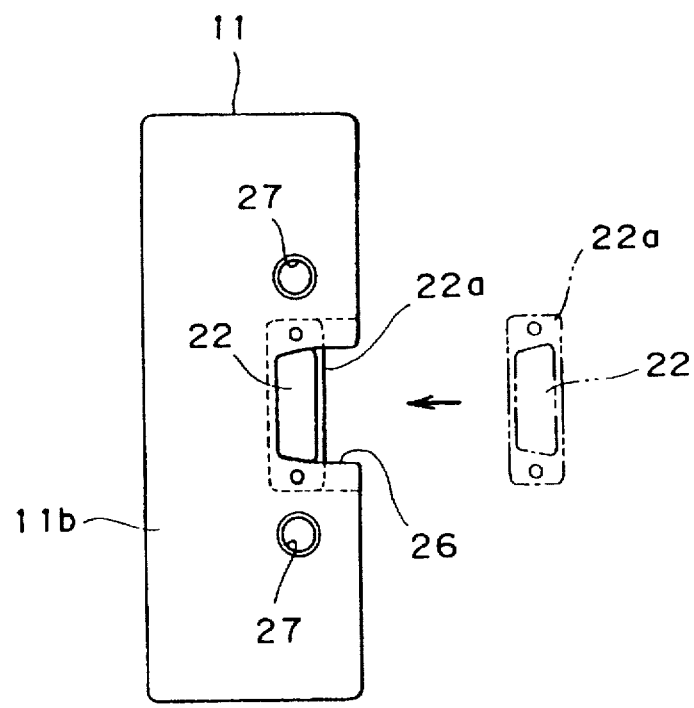
FIG. 9 is a rear view of the fan unit.
Figure 10:
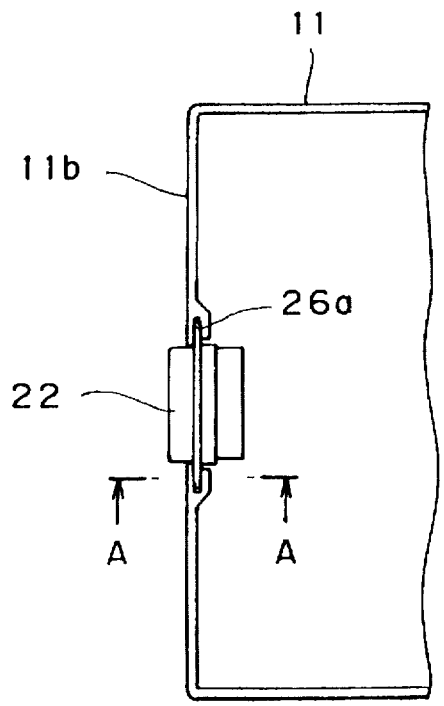
FIG. 10 is a top plan view of a rear portion of the fan unit.
Figure 11:
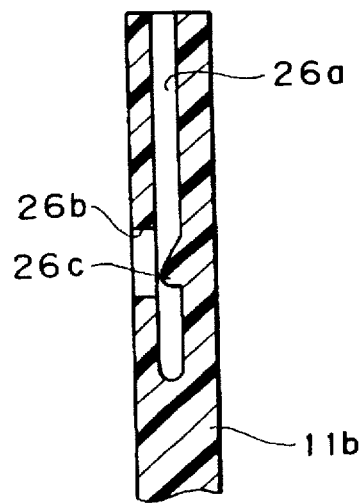
FIG. 11 is a cross section taken along the line A—A in FIG. 10.

FIGS. 9, 10, and 11 show the configuration of the rear plate 11b and its associated parts of the fan unit 3. The rear plate 11b of the fan unit 3 is formed with a substantially U-shaped recess 26 for mounting the unit-side connector 22. The unit-side connector 22 has a substantially rectangular platelike flange portion 22a having a pair of through-holes. The inner peripheral surface of the recess 26 of the rear plate 11b is formed with a guide groove 26a in which the flange portion 22a is inserted. Further, the guide groove 26a is formed with a pair of through-holes 26b inclined on its upper side at positions corresponding to the pair of through-holes of the flange portion 22a of the unit-side connector 22. In mounting the unit-side connector 22, the flange portion 22a of the unit-side connector 22 is inserted into the guide groove 26a of the recess 26. At this time, the engaging projections 26c of the guide groove 26a are inserted (engaged) into the through-holes of the flange portion 22a, thereby mounting the unit-side connector 22 on the unit housing 11. A pair of guide holes 27 are formed on the opposite sides of the recess 26 of the rear plate 11b in the vicinity thereof. The unit guide projections provided on the opposite sides of the cabinet-side connector of the cabinet 1 in the vicinity thereof are inserted into the guide holes 27 of the rear plate 11b of the unit housing 11.

Figure 12:
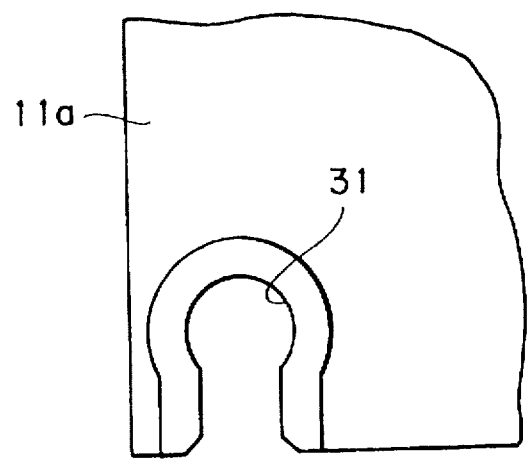
FIG. 12 is an enlarged elevational view of a unit fixing screw mounting portion of the unit housing.
Figure 13:
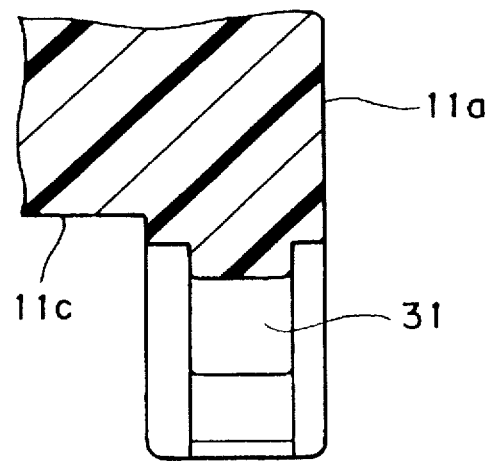
FIG. 13 is a longitudinal sectional view of FIG. 12.
Figure 14:
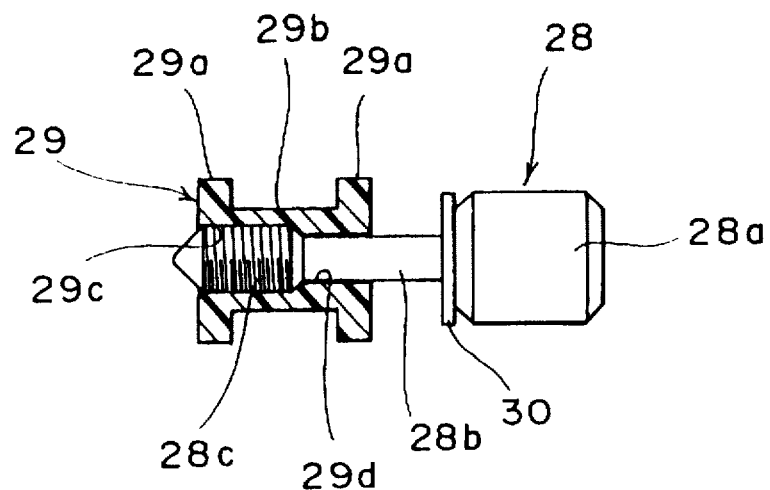
FIG. 14 is a partially sectional side view of a unit fixing screw and a stop member in a condition where a threaded portion of the screw is retracted in the stop member.
Figure 15:
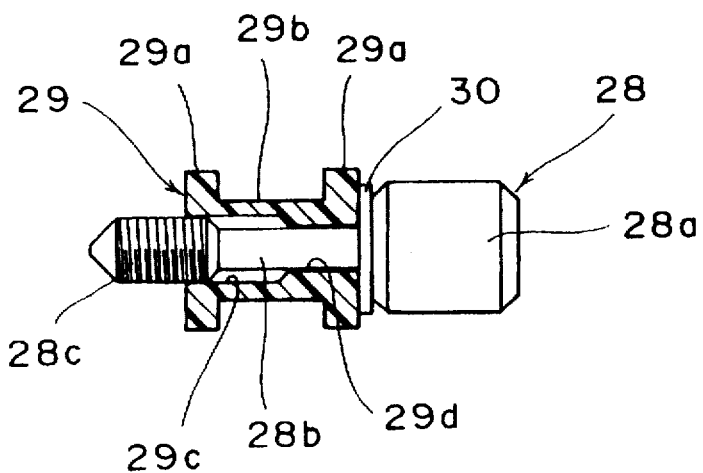
FIG. 15 is a view similar to FIG. 14, showing a condition where the threaded portion of the screw is projected from the stop member.
Figure 16:
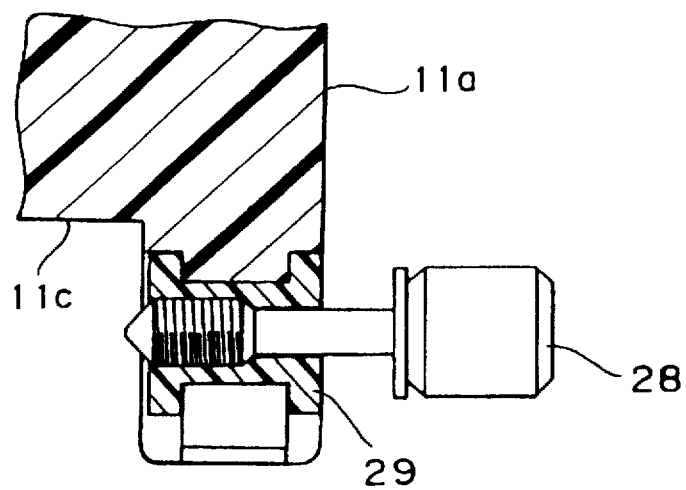
FIG. 16 is a partially sectional side view showing a condition where the screw retained by the stop member is mounted on the unit fixing screw mounting portion of the unit housing.

FIGS. 12 to 16 show the configuration of a unit fixing screw for fixing the fan unit 3 to the cabinet 1 and the configuration of a mounting portion for the unit fixing screw. As shown in FIG. 2, the lower portion of the front plate 11a of the unit housing 11 projects beyond the lower plate 11c, and a pair of unit fixing screws 28 are mounted in the vicinity of the opposite corners of the projecting lower portion of the front plate 11a. As shown in FIGS. 14 and 15, each unit fixing screw 28 consists of a head portion 28a, a neck portion 28b, and a threaded portion 28c. The neck portion 28b is smaller in diameter than the threaded portion 28c. A stop member 29 is mounted on the screw 28. The stop member 29 is a substantially cylindrical member having a pair of outer large-diameter portions 29a formed at the opposite ends, an inner small-diameter portion 29b formed between the outer large-diameter portions 29a, an inner large-diameter portion 29c formed at one end portion, and an inner small-diameter portion 29d formed at the other end portion. The inner diameter of the inner small-diameter portion 29d of the stop member 29 is set slightly smaller than the outer diameter of the neck portion 28b of the screw 28. The inner diameter of the inner large-diameter portion 29c is set slightly larger than the outer diameter of the threaded portion 28c of the screw 28. The screw 28 is retained in such a manner that the neck portion 28b extends through the inner small-diameter portion 29d of the stop member 29. Further, the screw 28 is axially slidable in such a manner that the threaded portion 28c is retained in the inner large-diameter portion 29c of the stop member 29 or projected from the stop member 29. Reference numeral 30 denotes a washer. As shown in FIGS. 12 and 13, each corner of the lower portion of the front plate 11a projecting beyond the lower plate 11c of the unit housing 11 is formed with a recessed mounting portion 31 for the screw 28 retained by the stop member 29. The outer large-diameter portions 29a and the outer small-diameter portion 29b of the stop member 29 are detachably engaged with the mounting portion 31. As shown in FIG. 16, the stop member 29 retaining the screw 28 is engaged with the mounting portion 31, thus being retained by the unit housing 11. In fixing the fan unit 3 to the cabinet 1, the fan unit 3 is first inserted into the cabinet 1, and the two screws 28 are next threadedly engaged with two corresponding tapped holes formed in the cabinet 1.

According to this preferred embodiment, the following various advantages can be obtained.

Since the unit housing 11 is integrally formed by resin molding to form all parts (including the finger guard portions 15), the unit housing 11 can be manufactured easily and reduced in weight and cost as compared with the conventional unit housing formed by sheet metal working. Each fan 12 is fixed to the unit housing 11 by first inserting (engaging) the fan 12 into the corresponding fan mounting portion 13 of the unit housing 11 to thereby engage the fan fixing projections 16 of the fan mounting portion 13 into the corresponding fan fixing holes 12a of the frame member of the fan 12, and next mounting the upper plate 17 to thereby press the fan 12 by means of the fan pressing portion 18b of the upper plate 17. Accordingly, the number of parts can be reduced and the work for mounting, replacement, etc. of the fan 12 can be easily performed as compared with the conventional configuration employing a plurality of special screws for fixing a fan. The printed wiring board 23 is mounted on the unit housing 11 by first inserting the lower edge of the printed wiring board 23 into the guide groove 24 and next pivoting the printed wiring board 23 about the lower edge to thereby fix the printed wiring board 23 by means of the printed wiring board pressing projections 25a and the printed wiring board holding hooks 25b. Accordingly, the printed wiring board 23 can be easily mounted and replaced. The unit-side connector 22 is mounted on the unit housing 11 by inserting the flange portion 22a of the connector 22 into the guide groove 26a of the recess 26 of the rear plate 11b until the engaging projections 26c of the guide groove 26a comes to engagement with the through-holes of the flange portion 22a. Accordingly, the connector 22 can be easily mounted, and the number of parts can be reduced. Each screw 28 for fixing the fan unit 3 to the cabinet 1 is mounted on the unit housing 11 by engaging the stop member 29 retaining the screw 28 into the mounting portion 31 of the front plate 11a. Accordingly, the screw 28 can be simply mounted and can be stabilized in position, so that the fan unit 3 can be mounted into the cabinet 1 easily with high reliability.

Some modifications of the above preferred embodiment will now be described with reference to FIGS. 17 to 22.

Figure 17:
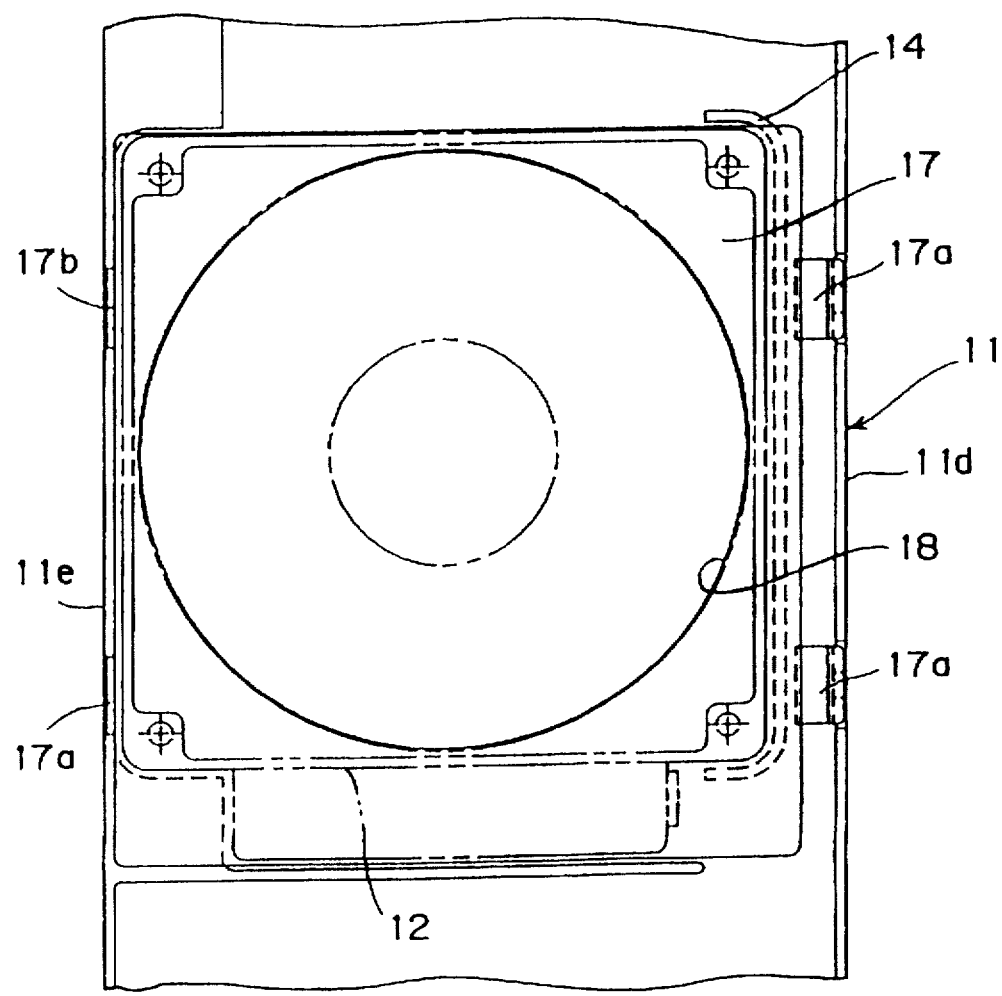
FIG. 17 is an enlarged top plan view of a part of a first modification wherein an upper plate in the preferred embodiment is partially modified.
Figure 18:
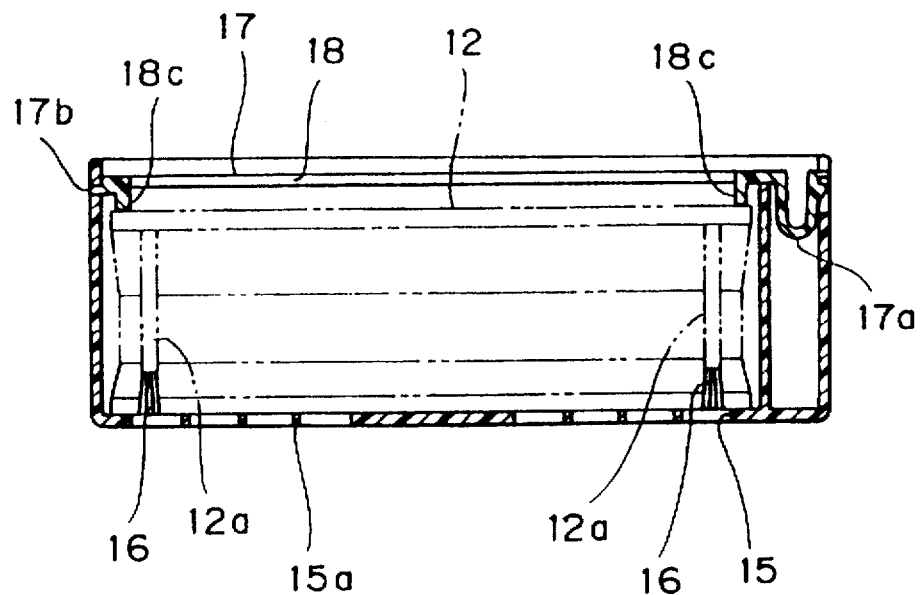
FIG. 18 is a transverse sectional view of FIG. 17.

FIGS. 17 and 18 show a first modification wherein each upper plate 17 in the above preferred embodiment is modified. The difference will be easily understood in comparison with FIGS. 5 and 6. That is, in the case that insertion of the fingers into the ventilation opening 18 of the upper plate 17 is less possible, the finger guard portion 18a may be omitted from the ventilation opening 18. In this case, fan pressing portions 18c for pressing each fan 12 are formed in the vicinity of the outer periphery of the ventilation opening 18.

Figure 19:
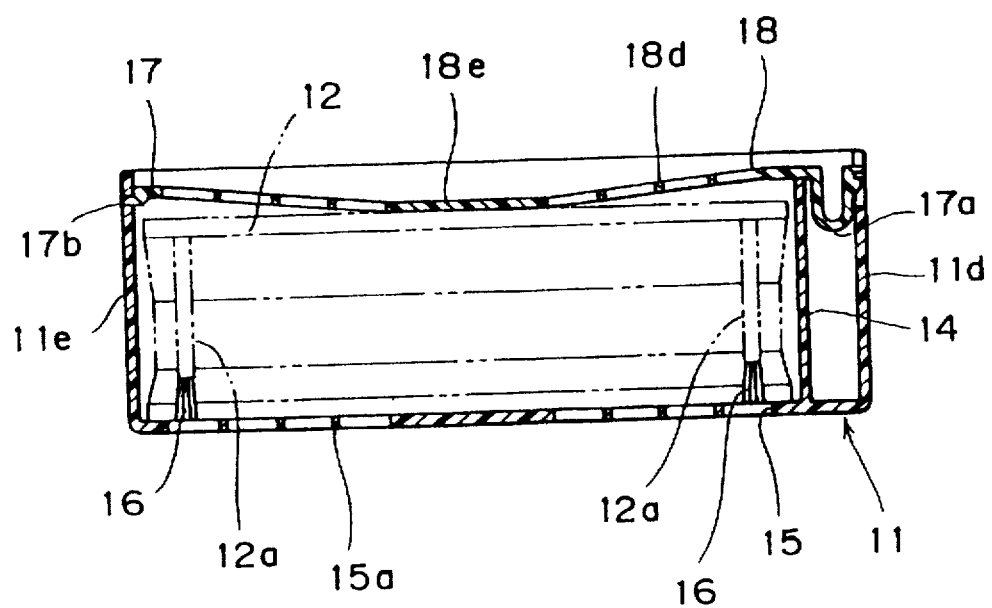
FIG. 19 is a transverse sectional view of a second modification wherein the upper plate in the preferred embodiment is partially modified.

FIG. 19 shows a second modification wherein each upper plate 17 in the above preferred embodiment is modified. The difference will be easily understood in comparison with FIG.

6. A finger guard portion 18d of the upper plate 17 in this modification is so formed as to be gradually lowered (projected inward) from its peripheral portion toward its central portion 18e. The central portion 18e of the finger guard portion 18d functions as the fan pressing portion for pressing the fan 12.

Figure 20:
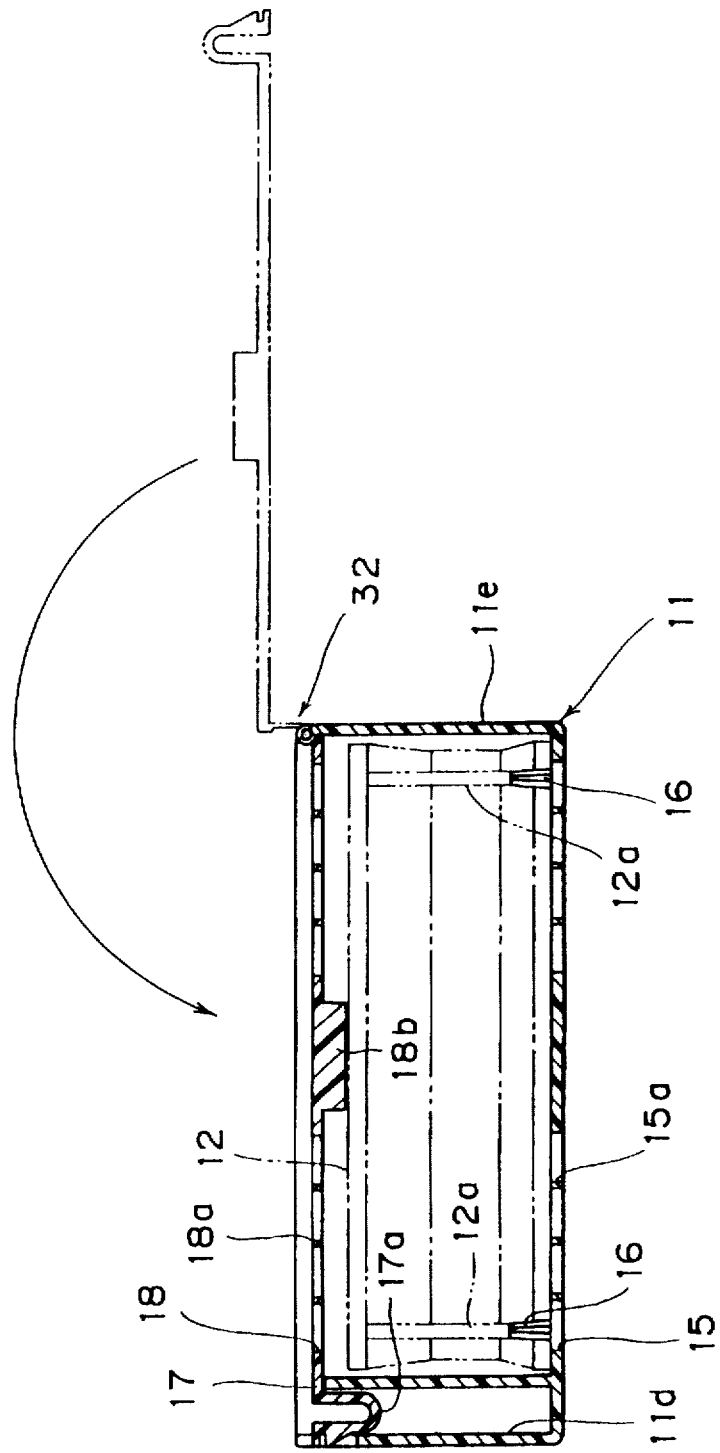
FIG. 20 is a transverse sectional view of a third modification wherein the unit housing and the upper plate in the preferred embodiment are partially modified.

FIG. 20 shows a third modification wherein the unit housing 11 and each upper plate 17 in the above preferred embodiment are modified. The difference will be easily understood in comparison with FIG. 6. In FIG. 6, the unit housing 11 and each upper plate 17 are separately formed by resin molding. To the contrary, in this modification, the unit housing 11 and each upper plate 17 are formed integrally with each other so as to be connected through a thin-walled hinge portion 32, so that the upper plate 17 can be pivotably opened and closed. With this structure, the number of parts can be reduced, and the parts can be easily handled.

Figure 21:
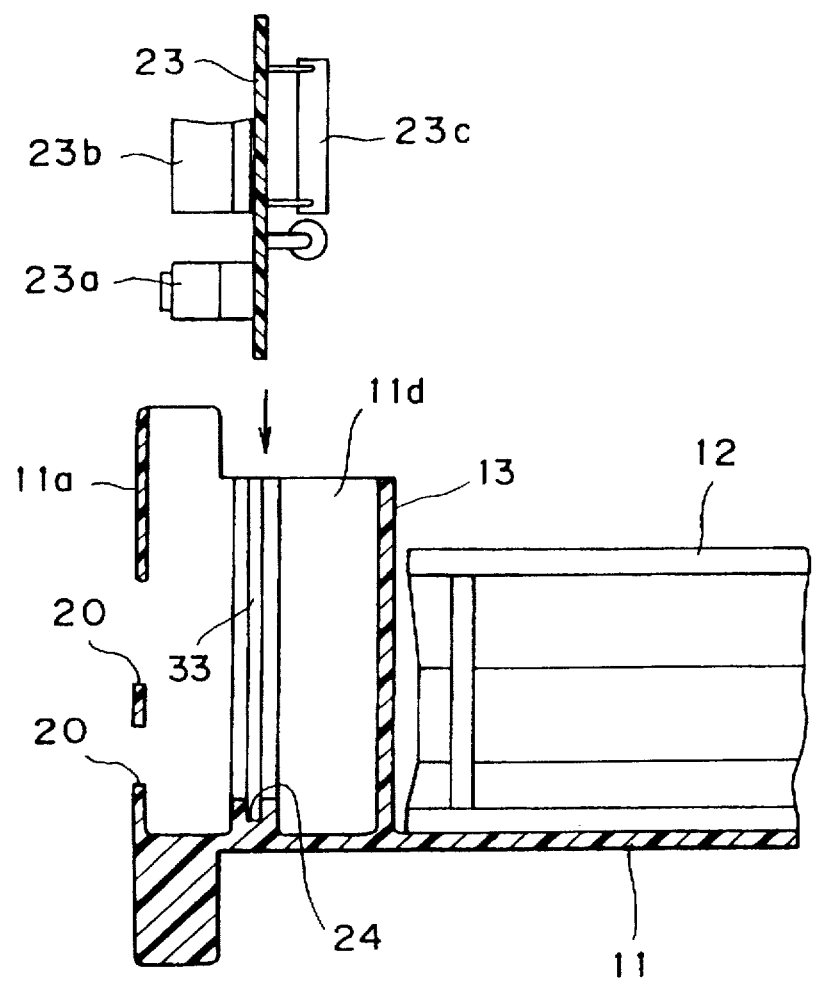
FIG. 21 is a longitudinal sectional view of a fourth modification wherein the unit housing in the preferred embodiment is partially modified, illustrating a condition where a printed wiring board is being mounted into the fan unit.
Figure 22:
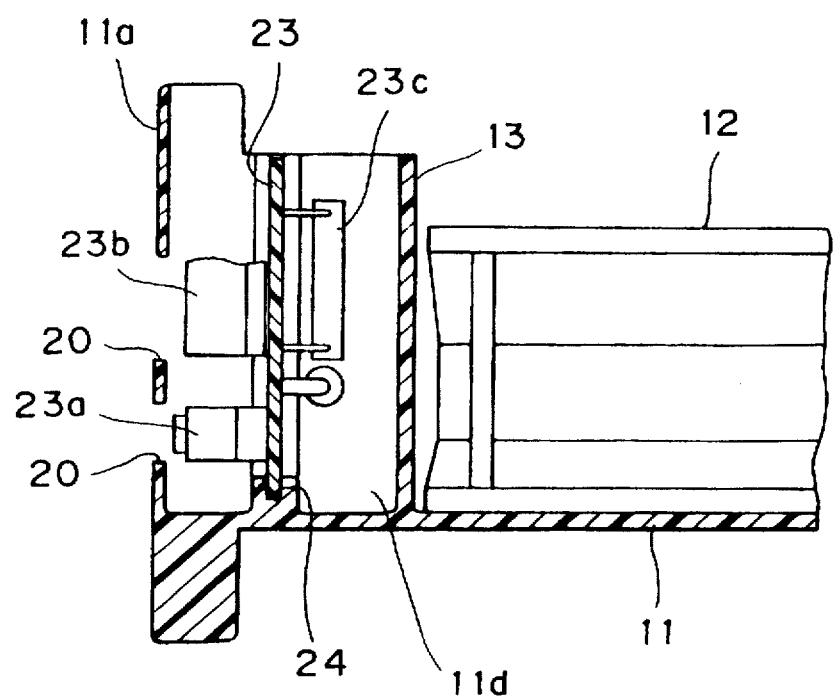
FIG. 22 is a view similar to FIG. 21, illustrating a condition where the printed wiring board has been mounted into the fan unit.

FIGS. 21 and 22 show a fourth modification wherein the printed wiring board mounting portion in the above preferred embodiment is modified. The difference will be easily understood in comparison with FIGS. 7 and 8. That is, the printed wiring board pressing projections 25a and the printed wiring board holding hooks 25b shown in FIGS. 7 and 8 are eliminated in this modification, and a pair of printed wiring board guide rails (grooves) 33 are instead formed on the inner surfaces of the left side plate 11d and the right side plate 11e of the unit housing 11 so as to be opposed to each other and extend from the upper opening to the guide groove 24 of the lower plate 11c. As shown in FIG. 21, the printed wiring board 23 is mounted in such a manner that the opposite side edges of the printed wiring board 23 are inserted into the guide rails 33. Thus, the printed wiring board 23 can be easily mounted on the mounting portion of the unit housing 11 as shown in FIG. 22.

What is claimed is:

1. A fan unit adapted to be detachably inserted and mounted into a cabinet for an electronic device accommodating a plurality of electronic circuit units, for forcibly air-cooling an interior of said cabinet, comprising:

a fan having a frame member for generating an air flow;

a unit housing integrally formed by resin molding, said unit housing being of a rectangular parallelepiped box-shape having a front plate, a rear plate, a lower plate, a first side plate, a second side plate, and an upper opening, said unit housing having a recessed fan mounting portion inside said lower plate, for engagingly accommodating said fan means, said fan mounting portion having an upper opening, said lower plate having at its portion corresponding to a bottom surface of said fan mounting portion a first ventilation opening for allowing pass of said air flow generated by said fan means;

a connector means for electrical connection with said electronic device, said connector means being mounted on said rear plate of said unit housing so that a part of said connector means is exposed;

an upper plate formed by resin molding and detachably mounted on said unit housing so as to close said upper opening of said fan mounting portion of said unit housing, said upper plate having a second ventilation opening for allowing said air flow generated by said fan means to pass therethrough;

said first side plate of said unit housing at an edge portion includes a first engaging hole;

said second side plate of said unit housing near an edge portion includes a second engaging hole;

said upper plate at a position corresponding to said first engaging hole includes a first engaging projection for engaging said first engaging hole; and said upper plate at a position corresponding to said second engaging hole includes a second engaging projection for engaging said second engaging hole.

2. A fan unit according to claim 1, wherein said unit housing is integrally formed with a first finger guard portion like a spiderweb in said first ventilation opening, for preventing insertion of fingers into said first ventilation opening.

3. A fan unit according to claim 2, wherein:

said unit housing is integrally formed with a plurality of pin portions projecting from said bottom surface of said fan mounting portion toward said upper opening of said fan mounting portion; and said frame member of said fan means is formed with a plurality of fan fixing holes for respectively engaging said pin portions.

4. A fan unit according to claim 1, wherein said upper plate is integrally formed with a second finger guard portion like a spiderweb in said second ventilation opening, for preventing insertion of fingers into said second ventilation opening.

5. A fan unit according to claim 4, wherein said upper plate and said unit housing are integrally connected with each other through a thin-walled hinge portion formed at an upper edge portion of said first side plate of said unit housing.

6. A fan unit according to claim 1, wherein said upper plate is integrally formed near an edge portion of said second ventilation opening with a fan pressing portion projecting inward so as to press said frame member of said fan means against said lower plate in a condition that said upper plate is mounted on said fan mounting portion.

7. A fan unit according to claim 1, wherein:

said front plate of said unit housing is formed near its inner surface with a recessed printed wiring board accommodating portion having an upper opening, for accommodating a printed wiring board on which electronic components including an indicator lamp are mounted;

said lower plate is formed at its portion corresponding to a bottom surface of said printed wiring board accommodating portion with a guide groove for guiding a lower edge of said printed wiring board;

said front plate is formed on its inner surface with printed wiring board holding means projecting inward to disengageably engage an upper edge of said printed wiring board; and said front plate is formed with a through-hole for exposing a part of said electronic components including said indicator lamp;

whereby said printed wiring board is accommodated into said printed wiring board accommodating portion by first inserting said lower edge of said printed wiring board into said guide groove, and next pivoting said printed wiring board toward said front plate about said lower edge until said upper edge of said printed wiring board comes into engagement with said printed wiring board holding means, and said part of said electronic components is exposed through said through-hole of said front plate.

8. A fan unit according to claim 1, wherein:

said first plate of said unit housing is formed near its inner surface with a recessed printed wiring board accommodating portion having an upper opening, for accommodating a printed wiring board on which electronic components including an indicator lamp are mounted;

said first and second side plates of said unit housing are respectively formed on their inner surfaces with first and second guide grooves opposed to each other, for guiding opposite side edges of said printed wiring board; and said front plate is formed with a through-hole for exposing a part of said electronic components including said indicator lamp;

whereby said printed wiring board is accommodated into said printed wiring board accommodating portion by inserting said opposite side edges of said printed wiring board into said first and second guide grooves of said first and second side plates until said part of said electronic components is exposed through said through-hole of said front plate.

9. A fan unit according to claim 1, wherein:

said connector means has a rectangular platelike flange portion; and said rear plate of said unit housing is formed with a substantially U-shaped recess having an upper opening, said recess having on its inner peripheral surface a connector guide groove for guiding said flange portion of said connector means.

10. A fan unit according to claim 9, wherein:

said flange portion of said connector means has a pair of connector fixing holes; and said connector guide groove of said unit housing along said inner peripheral surface of said recess is formed at positions corresponding to said connector fixing holes with a pair of connector fixing projections respectively engaging with said connector fixing holes.

11. A fan unit according to claim 1, further comprising:

a cylindrical stop member having a pair of outer large-diameter portion formed at opposite ends, an outer small-diameter portion formed between said outer large-diameter portions, an inner large-diameter portion formed at one end portion, and an inner small-diameter portion formed at the other end portion;

a screw for fixing said fan unit to said cabinet, said screw having a neck portion smaller in diameter than said inner small-diameter portion of said stop member and a threaded portion larger in diameter than said inner small-diameter portion and smaller in diameter than said inner large-diameter portion, said screw being slidably retained in said stop member so that said threaded portion of said screw is adapted to be retracted into and projected out of said inner large-diameter portion of said stop member;

a unit fixing end portion projecting from said front plate of said unit housing; and a recessed screw mounting portion formed in said unit fixing end portion, for detachably engaging said stop member retaining said screw;

whereby said screw is mounted on said unit housing by engaging said stop member into said screw mounting portion.

12. A fan unit according to claim 1, further comprising:

a recessed cable duct having an upper opening, formed between said fan mounting portion and one of said first and second side plates of said unit housing so as to extend from said rear plate near to said front plate; and a cable accommodated in said cable duct, for electrically connecting said connector means to said fan means.

13. A fan unit according to claim 12, further comprising a plurality of projections formed on opposed inner walls of said cable duct at positions in the vicinity of said upper opening of said cable duct in a staggered configuration, for preventing escape of said cable from said cable duct.

14. A fan unit adapted to be detachably inserted and mounted into a cabinet for an electronic device accommodating a plurality of electronic circuit units, for forcibly air-cooling an interior of said cabinet, comprising:

a fan having a frame member for generating an air flow;

a unit housing integrally formed by resin molding, said unit housing being of a rectangular parallelepiped box-shape having a front plate, a rear plate, a lower plate, a first side plate, a second side plate, and an upper opening, said unit housing having a recessed fan mounting portion inside said lower plate, for engagingly accommodating said fan means, said fan mounting portion having an upper opening, said lower plate having at its portion corresponding to a bottom surface of said fan mounting portion a first ventilation opening for allowing pass of said air flow generated by said fan means;

a connector means for electrical connection with said electronic device, said connector means being mounted on said rear plate of said unit housing so that part of said connector means is exposed;

an upper plate formed by resin molding and detachably mounted on said unit housing so as to close said upper opening of said fan mounting portion of said unit housing, said upper plate having a second ventilation opening for allowing pass of said air flow generated by said fan means;

wherein said upper plate is integrally formed with a second finger guard portion like a spiderweb in said second ventilation opening, for preventing insertion of fingers into said second ventilation opening;

wherein said second finger guard portion of said upper plate is integrally formed at its central portion with a fan pressing portion projecting inward so as to press said frame member of said fan means against said lower plate in a condition that said upper plate is mounted on said fan mounting portion.

15. A fan unit adapted to be detachably inserted and mounted into a cabinet for an electronic device accommodating a plurality of electronic circuit units, for forcibly air-cooling an interior of said cabinet, comprising:

a fan having a frame member for generating an air flow;

a unit housing integrally formed by resin molding, said unit housing being of a rectangular parallelepiped box-shape having a front plate, a rear plate, a lower plate, a first side plate, a second side plate, and an upper opening, said unit housing having a recessed fan mounting portion inside said lower plate, for engagingly accommodating said fan means, said fan mounting portion having an upper opening, said lower plate having at its portion corresponding to a bottom surface of said fan mounting portion a first ventilation opening for allowing pass of said air flow generated by said fan means;

a connector means for electrical connection with said electronic device, said connector means being mounted on said rear plate of said unit housing so that part of said connector means is exposed;

an upper plate formed by resin molding and detachably mounted on said unit housing so as to close said upper opening of said fan mounting portion of said unit housing, said upper plate having a second ventilation opening for allowing pass of said air flow generated by said fan means;

wherein said upper plate is integrally formed with a second finger guard portion like a spiderweb in said second ventilation opening, for preventing insertion of fingers into said second ventilation opening;

wherein said second finger guard portion of said upper plate is gradually recessed inward from its peripheral portion toward its central portion, said central portion of said second finger guard portion presses said frame member of said fan means against said lower plate in a condition that said upper plate is mounted on said fan mounting portion.

* * * * *